United States Patent
Schiano et al.

(10) Patent No.: US 7,710,116 B2
(45) Date of Patent: *May 4, 2010

(54) METHOD FOR REDUCING THE COUPLING DURING RECEPTION BETWEEN EXCITATION AND RECEIVE COILS OF A NUCLEAR QUADRUPOLE RESONANCE DETECTION SYSTEM

(75) Inventors: Jeffrey L. Schiano, State College, PA (US); Charles Wilker, Wilmington, DE (US)

(73) Assignee: The Penn State Research Foundation, University Park, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/980,269

(22) Filed: Oct. 30, 2007

(65) Prior Publication Data

US 2008/0129291 A1    Jun. 5, 2008

Related U.S. Application Data

(63) Continuation of application No. 11/292,742, filed on Dec. 2, 2005, now Pat. No. 7,388,377.

(60) Provisional application No. 60/632,833, filed on Dec. 3, 2004.

(51) Int. Cl.
   *G01V 3/00*      (2006.01)

(52) U.S. Cl. .................. 324/311; 324/300; 324/309; 324/312; 324/318; 324/322

(58) Field of Classification Search ......... 324/300–322; 600/410, 422
See application file for complete search history.

(56) References Cited

U.S. PATENT DOCUMENTS

| 3,373,348 | A | | 3/1968 | Vanier et al. | |
|---|---|---|---|---|---|
| 3,515,981 | A | * | 6/1970 | Tong et al. | .................. 324/310 |

(Continued)

FOREIGN PATENT DOCUMENTS

EP         0 426 851        5/1991

(Continued)

OTHER PUBLICATIONS

Miller et al, "Performance of a High-Temerature Superconducting Probe for in Vivo Microcopy at 2.0 T", Magnetic Resonance in Medicine, (1999) pp. 72-79, vol. 41.

(Continued)

*Primary Examiner*—Brij B. Shrivastav
*Assistant Examiner*—Tiffany A Fetzner
(74) *Attorney, Agent, or Firm*—Gifford, Krass, Sprinkle, Anderson & Citkowski, P.C.

(57) ABSTRACT

This invention relates to a method for improving the performance of a nuclear quadrupole resonance detection system by reducing, during reception, the coupling between one or more excitation coils that provide a radio frequency magnetic field that excites quadrupole nuclei, and one or more high temperature superconductor receive coils that detect the resulting nuclear quadrupole resonance signal.

16 Claims, 3 Drawing Sheets

U.S. PATENT DOCUMENTS

| | | | |
|---|---|---|---|
| 3,530,374 A * | 9/1970 | Waugh et al. | 324/311 |
| 3,764,992 A | 10/1973 | Rollwit | |
| 4,072,768 A | 2/1978 | Fraser et al. | |
| 4,514,691 A | 4/1985 | De Los Santos et al. | |
| 5,036,279 A | 7/1991 | Jonsen | |
| 5,135,908 A | 8/1992 | Yang et al. | |
| 5,206,592 A | 4/1993 | Buess et al. | |
| 5,233,300 A | 8/1993 | Buess et al. | |
| 5,258,710 A | 11/1993 | Black et al. | |
| 5,262,394 A | 11/1993 | Wu et al. | |
| 5,276,398 A | 1/1994 | Withers et al. | |
| 5,351,007 A | 9/1994 | Withers et al. | |
| 5,418,213 A | 5/1995 | Tanaka et al. | |
| 5,457,385 A | 10/1995 | Sydney et al. | |
| 5,565,778 A | 10/1996 | Brey et al. | |
| 5,583,437 A | 12/1996 | Smith et al. | |
| 5,585,723 A | 12/1996 | Withers | |
| 5,592,083 A | 1/1997 | Magnuson et al. | |
| 5,594,338 A | 1/1997 | Magnuson | |
| 5,656,937 A | 8/1997 | Cantor | |
| 5,661,400 A | 8/1997 | Plies et al. | |
| 5,750,473 A | 5/1998 | Shen | |
| 5,751,146 A | 5/1998 | Hrovat | |
| 5,804,967 A | 9/1998 | Miller et al. | |
| 5,814,987 A | 9/1998 | Smith et al. | |
| 5,814,989 A | 9/1998 | Smith et al. | |
| 5,814,992 A | 9/1998 | Busse-Gravitz et al. | |
| 5,872,080 A | 2/1999 | Arendt et al. | |
| 5,952,269 A | 9/1999 | Ma et al. | |
| 5,973,495 A | 10/1999 | Mansfield | |
| 5,986,455 A | 11/1999 | Magnuson | |
| 5,999,000 A | 12/1999 | Srinivasan | |
| 6,025,719 A | 2/2000 | Anderson | |
| 6,054,856 A | 4/2000 | Garroway et al. | |
| 6,088,423 A | 7/2000 | Krug et al. | |
| 6,091,240 A | 7/2000 | Smith et al. | |
| 6,104,190 A | 8/2000 | Buess et al. | |
| 6,108,569 A | 8/2000 | Shen | |
| 6,150,816 A | 11/2000 | Srinivasan | |
| 6,166,541 A | 12/2000 | Smith et al. | |
| 6,169,399 B1 | 1/2001 | Zhang et al. | |
| 6,194,898 B1 | 2/2001 | Magnuson et al. | |
| 6,201,392 B1 | 3/2001 | Anderson et al. | |
| 6,218,943 B1 | 4/2001 | Ellenbogen | |
| 6,242,918 B1 | 6/2001 | Miller et al. | |
| 6,291,994 B1 | 9/2001 | Kim et al. | |
| 6,335,622 B1 | 1/2002 | James et al. | |
| 6,370,404 B1 | 4/2002 | Shen | |
| D459,245 S | 6/2002 | Power | |
| 6,420,872 B1 | 7/2002 | Garroway et al. | |
| 6,478,434 B1 | 11/2002 | Streetman et al. | |
| 6,486,838 B1 | 11/2002 | Smith et al. | |
| 6,503,831 B2 | 1/2003 | Speakman | |
| 6,538,445 B2 | 3/2003 | James et al. | |
| 6,541,966 B1 | 4/2003 | Keene | |
| 6,556,013 B2 | 4/2003 | Withers | |
| 6,566,873 B1 | 5/2003 | Smith et al. | |
| 6,590,394 B2 | 7/2003 | Wang et al. | |
| 6,617,591 B1 | 9/2003 | Simonson et al. | |
| 6,653,917 B2 | 11/2003 | Kang et al. | |
| 6,751,489 B2 | 6/2004 | Shen | |
| 6,751,847 B1 | 6/2004 | Brey et al. | |
| 6,777,937 B1 | 8/2004 | Miller et al. | |
| 6,819,109 B2 | 11/2004 | Sowers et al. | |
| 6,822,444 B2 | 11/2004 | Lai | |
| 6,847,208 B1 | 1/2005 | Crowley et al. | |
| 6,952,163 B2 | 10/2005 | Muey et al. | |
| 6,956,476 B2 | 10/2005 | Buess et al. | |
| 6,958,608 B2 | 10/2005 | Takagi et al. | |
| 7,049,814 B2 | 5/2006 | Mann | |
| 7,106,058 B2 * | 9/2006 | Wilker et al. | 324/300 |
| 7,187,169 B2 * | 3/2007 | Clarke et al. | 324/307 |
| 7,196,454 B2 | 3/2007 | Baur et al. | |
| 7,265,549 B2 * | 9/2007 | Alvarez et al. | 324/310 |
| 7,279,896 B2 * | 10/2007 | Alvarez et al. | 324/310 |
| 7,279,897 B2 * | 10/2007 | Alvarez et al. | 324/310 |
| 7,292,041 B2 * | 11/2007 | Alvarez et al. | 324/322 |
| 7,301,344 B2 * | 11/2007 | McCambridge | 324/322 |
| 7,332,910 B2 * | 2/2008 | Laubacher et al. | 324/318 |
| 7,375,525 B2 * | 5/2008 | Laubacher et al. | 324/318 |
| 7,388,377 B2 * | 6/2008 | Alvarez et al. | 324/311 |
| 2002/0068682 A1 | 6/2002 | Shen | |
| 2002/0153891 A1 | 10/2002 | Smith et al. | |
| 2002/0156362 A1 | 10/2002 | Bock et al. | |
| 2002/0169374 A1 | 11/2002 | Jevtic | |
| 2002/0190715 A1 | 12/2002 | Marek | |
| 2003/0020553 A1 | 1/2003 | Gao et al. | |
| 2003/0062896 A1 * | 4/2003 | Wong et al. | 324/318 |
| 2003/0071619 A1 | 4/2003 | Sauer et al. | |
| 2003/0119677 A1 | 6/2003 | Qiyan et al. | |
| 2003/0136920 A1 | 7/2003 | Flores et al. | |
| 2004/0124840 A1 | 7/2004 | Reykowski | |
| 2004/0222790 A1 | 11/2004 | Karmi et al. | |
| 2004/0251902 A1 | 12/2004 | Takagi et al. | |
| 2005/0104593 A1 | 5/2005 | Laubacher et al. | |
| 2005/0122109 A1 * | 6/2005 | Wilker et al. | 324/318 |
| 2005/0140371 A1 * | 6/2005 | Alvarez | 324/322 |
| 2005/0146331 A1 | 7/2005 | Flexman et al. | |
| 2005/0206382 A1 | 9/2005 | Laubacher et al. | |
| 2005/0248345 A1 | 11/2005 | Alvarez | |
| 2005/0258831 A1 | 11/2005 | Alvarez | |
| 2005/0264289 A1 | 12/2005 | Alvarez | |
| 2005/0270028 A1 | 12/2005 | Alvarez et al. | |
| 2006/0012371 A1 * | 1/2006 | Laubacher et al. | 324/322 |
| 2006/0038563 A1 | 2/2006 | Cisholm et al. | |
| 2006/0082368 A1 * | 4/2006 | McCambridge | 324/318 |
| 2006/0091881 A1 * | 5/2006 | Clarke et al. | 324/301 |
| 2006/0119357 A1 * | 6/2006 | Alvarez et al. | 324/311 |
| 2006/0119360 A1 | 6/2006 | Yamamoto et al. | |
| 2008/0001602 A1 * | 1/2008 | Schiano et al. | 324/318 |
| 2008/0036462 A1 * | 2/2008 | Schiano | 324/318 |
| 2008/0094061 A1 * | 4/2008 | Laubacher et al. | 324/318 |
| 2008/0129291 A1 * | 6/2008 | Schiano et al. | 324/311 |

FOREIGN PATENT DOCUMENTS

| | | |
|---|---|---|
| EP | 1 122 550 A1 | 8/2001 |
| EP | 1 168 483 | 1/2002 |
| EP | 1 416 291 | 5/2004 |
| EP | 1 477 823 A | 11/2004 |
| GB | 2 286 248 | 8/1995 |
| GB | 2 289 344 | 11/1995 |
| JP | 05 269108 | 10/1993 |
| JP | 07 265278 | 10/1995 |
| WO | WO 92/17793 | 10/1992 |
| WO | WO 92/17794 | 10/1992 |
| WO | WO 92/19978 | 11/1992 |
| WO | WO 92/21989 | 12/1992 |
| WO | WO 94/05022 | 3/1994 |
| WO | WO 95/34096 | 12/1995 |
| WO | WO 96/38636 | 12/1996 |
| WO | WO 96/39638 | 12/1996 |
| WO | WO 98/37438 | 8/1998 |
| WO | WO 98/54590 | 12/1998 |
| WO | WO 99/45409 | 9/1999 |
| WO | WO 99/50689 | 10/1999 |
| WO | WO 00/70356 | 11/2000 |
| WO | WO 02/082115 A2 | 10/2002 |
| WO | WO 02/098364 | 12/2002 |
| WO | WO 03/014700 | 2/2003 |
| WO | WO 03/040761 | 5/2003 |
| WO | WO 03/096041 | 11/2003 |
| WO | WO 04/001454 A | 12/2003 |
| WO | WO 2004/102596 | 11/2004 |

WO WO 2005/059582 A1 6/2005

OTHER PUBLICATIONS

Wong et al, "HTS Coils for High Resolution Nuclear Magnetic Resonance Spectroscopy", Advances in Cryogenic Engineering, (1996) pp. 953-959 New York.

Kotsubo et al, "Cryogenic System for A High Temperature Superconductor NMR Probe", Advances in Cryogenic Engineering, Jul. 17, 1995, vol. 41 pp. 1857-1864 New York.

Kushida et al "Dependence on the Pure Quadruple Resonance Frequency of Pressure and Temperature" Physical Review, (Dec. 1956) pp. 1364-1377, vol. 104, No.5, Massachusetts.

Vanier "Temperature Dependence of the Pure Nuclear Quadruple Resonance Frequency in KC103" Canadian Journal of Physics, (Nov. 1960), pp. 1397-1405, vol. 38, No. 11, Canada.

Smith et al "Nitrogen Electric Quadruple and Proton Magnetic ResonanSces in Thiourea", Journal of Chemical Physics, (Oct. 1964), pp. 2403-2416, vol. 41, No. 8, New York.

Turner et al High Temperauter superconductor circuit components for cryogenic microwave systems, Electrical and Computer Engineering, 1993, Canadian Conference on Vancouver, BC Canada (Sep. 14-17, 1993) Sep. 14, 1993 XP 010118071.

Edelstein et al, A signal-to-noise calibration procedure for NMR systems, Medical Physics, vol. 11(2) Mar./Apr. 1984, pp. 180-185.

T. Hirschfield "Short Range Remote NQR Measurements", Journal of Molecular Structure, 1980, pp. 63-77, vol. 58, The Netherlands.

Garroway et al "Remote Sensing by Nuclear Quadruple Resonance", IEEE Transactions on Geoscience and Remote Ssensing, Jun. 2001, pp. 1108-1118, vol. 39, No. 6.

Garroway et al "Narcotics and Explosives Detection by 14N pure NQR", SPIE, 1993, pp. 318-327, vol. 2092, Maryland.

Wilker et al, "HTS Sensors for NQR Spectroscopy", vol. 1, pp. 143-146, 2004.

Anders Stensgaard, "Optimized Design of the Shielded-Loop Resonator", Journal of Magnetic Resonance, 122, 120-126 (1996) Article No. 0187.

P.B. Roemer "The NMR Phased Array," Magnetic Resonance in Medicine 16, 192-225 (1990).

He et al, "Metal detector based on high-Tc RF SQUID", Physica C 378-381 (2002) pp. 1404-1407.

Bendall, et. al, "Elimination of Coupling between Cylindrical Transmit Coils and Surface-Receive Coils for in Vivo NMR" Magnetic Resonance in Medicine v3 p. 157-163, 1986.

Black, et al., "A High-Temperature Superconducting Receiver for Nuclear Magnetic Resonance Microscopy", Science, vol. 259, pp. 793-795 Feb. 5, 1993.

Black, et al., "Performance of a High-Temperature Superconducting Resonator for High-Field Imaging", Journal of Magnetic Resonance, pp. 74-80 (1995).

Colton, et. al., "Making the World a Safer Place", Science, v.299, i.5611, pp. 1324-1325, Feb. 2006.

Fisher, et al., "A Versatile Computer-Controlled Pulsed Nuclear Quadrupole Resonance Spectrometer", Review of Scientific Instruments, v70, No. 12, p. 4678, Dec. 1999.

Hill, "Improved Sensitivity of NMR Spectroscopy Probes by Use of High-Temperature Superconductive Detection Coils", IEEE Transactions on Applied Superconductivity, vol. 7, pp. 3750-3753, Jun. 1997.

Withers, et al., "Thin-Film HTD Probe Coils for Magnetic-Resonance Imaging", IEEE Transactions on Applied Superconductivity, vol. 3, pp. 2450-2453, Mar. 1993.

Landers, et al., "Electronic Effects and Molecular Motion in β-Octahydro-1,3,5,7-tetranitro-1,3,5,7-tetrazocine Bases on 14N Nuclear Quadrupole Resonance Spectroscopy", American Chemical Society, J. Phys. Chem., 85, pp. 2618-2623, 1981.

Karpowicz, et. al., "Librational Motion of Hexahydro-1,3,5-trinitro-s⁻-triazine Based on the Temperature Dependence of the Nitrogen-14 Nuclear Quadrupole Resonance Spectra. The Relationship to Condensed-Phase Thermal Decomposition", American Chemical Society, J. Phys. Chem. 87, pp. 2109-2112, 1983.

Volpicelli, et. al., "Locked rf Spectrometer for Nuclear Quadrupole Resonance", The Review of Scientific Instruments, v.25, No. 2, pp. 150-153, Feb. 1965.

Benedek, et. al., "Precise Nuclear Resonance Thermometer", The Review of Scientific Instruments, v.28, No. 2, pp. 92-95, Feb. 1957.

Ernst, "Magnetic Resonance with Stochastic Excitation", Journal of Magnetic Resonance 3, pp. 10-27, 1970.

Klainer, et. al., "Fourier Transform Nuclear Quadrupole Resonance Spectroscopy", Fourier, Hadamard, and Hilbert Transforms in Chemistry, pp. 147-182, 1982.

* cited by examiner

METHOD FOR REDUCING THE COUPLING DURING RECEPTION BETWEEN EXCITATION AND RECEIVE COILS OF A NUCLEAR QUADRUPOLE RESONANCE DETECTION SYSTEM

This application is a continuation of U.S. patent application Ser. No. 11/292,742, filed Dec. 2, 2005, now pending.

TECHNICAL FIELD

This invention relates to a method for improving the performance of a nuclear quadrupole resonance detection system by reducing the coupling during reception between the excitation coils and receive coils thereof, wherein the receive coils are preferably high temperature superconductor receive coils.

BACKGROUND

The use of nuclear quadrupole resonance (NQR) as a means of detecting explosives and other contraband has been recognized for some time. See, e.g., T. Hirshfield et al, *J. Molec. Struct.* 58, 63 (1980); A. N. Garroway et al, *Proc. SPIE* 2092, 318 (1993); and A. N. Garroway et al, *IEEE Trans. on Geoscience and Remote Sensing* 39, 1108 (2001). NQR provides some distinct advantages over other detection methods. NQR requires no external magnet such as required by nuclear magnetic resonance, and NQR is sensitive to the compounds of interest, i.e. there is a specificity of the NQR frequencies.

One technique for measuring NQR in a sample is to place the sample within a solenoid coil that surrounds the sample. The coil provides a radio frequency (RF) magnetic field that excites the quadrupole nuclei in magnetic field that excites the quadrupole nuclei in the sample and results in their producing their characteristic resonance signals. This is the typical apparatus configuration that might be used for scanning mail, baggage or luggage.

There is also a need, however, for a NQR detector that permits detection of NQR signals from a source outside the detector, e.g. a wand detector, that could be passed over persons or containers as is done with existing metal detectors, or a panel detector that persons could stand on or near. Problems associated with such detectors using conventional systems are the decrease in detectability with distance from the detector coil and the associated equipment needed to operate the system.

A detection system can have one or more coils that serve as both excitation and receive coils, or it can have separate coils that only excite and only receive. An excitation, i.e. transmit, coil of an NQR detection system provides a radio frequency (RF) magnetic field that excites the quadrupole nuclei in the sample, and results in the quadrupole nuclei producing their characteristic resonance signals that the receive coil detects.

It can be especially advantageous to use a receive coil, i.e. a sensor, made of a high temperature superconductor ("HTS") rather than copper since the HTS self-resonant coil has a quality factor Q of the order of $10^3$-$10^6$. The NQR signals have low intensity and short duration. In view of the low intensity NQR signal, it is important to have a signal-to-noise ratio (S/N) as large as possible. The signal-to-noise ratio is proportional to the square root of Q so that the use of a HTS self-resonant coil as a sensor results in an increase in S/N by a factor of 10-100 over that of a copper coil. Therefore, the use of a high temperature superconductor receive coil with a large Q provides a distinct advantage over the use of an ordinary conductor coil.

Separate excitation and receive coils having the same resonance frequencies result in a coupling between the coils. This coupling can result in interference with the performance of the coils as well as damage to the receive coils.

An object of this invention is thus to provide a method for reducing the coupling between the excitation and receive coils in a NQR resonance detection system.

SUMMARY

This invention is directed to a method for shifting, during reception, the resonance frequency of the excitation coil(s) to thereby reduce the coupling between the excitation and receive coil(s).

During reception the resonance frequency of the transmit coil(s) is shifted. The shift in frequency, which is an increase or decrease in frequency, is performed in an amount that is sufficient to reduce the coupling between the coils to an acceptable level. After such a shift in resonance frequency, the resonance frequencies of the excitation and receive coils differ by at least about 10%.

Shifting resonance frequency in this manner to avoid coupling of coils improves the performance of a nuclear quadrupole resonance detection system, and this improvement in performance has particular value when the nuclear quadrupole resonance detection system is used for detecting the nuclear quadrupole resonance of an analyte material that constitutes a harmful or potentially harmful substance such as explosives, drugs (controlled substances) and/or other contraband. When screening samples, the presence of such a harmful or potentially harmful substance may be difficult to detect in the absence of the ability to verify its presence by detecting therein a certain nuclear quadrupole resonance that is characteristic of an analyte material of interest.

Yet another embodiment of this invention is consequently a method as described above wherein the nuclear quadrupole resonance detection system detects nuclear quadrupole resonance that is characteristic of an analyte material that constitutes a harmful or potentially harmful substance. This is accomplished, for example, by applying the excitation of a transmit coil to a sample to be screened for the detection of the presence of explosives, drugs or other contraband.

DETAILED DESCRIPTION

Figure 1A:
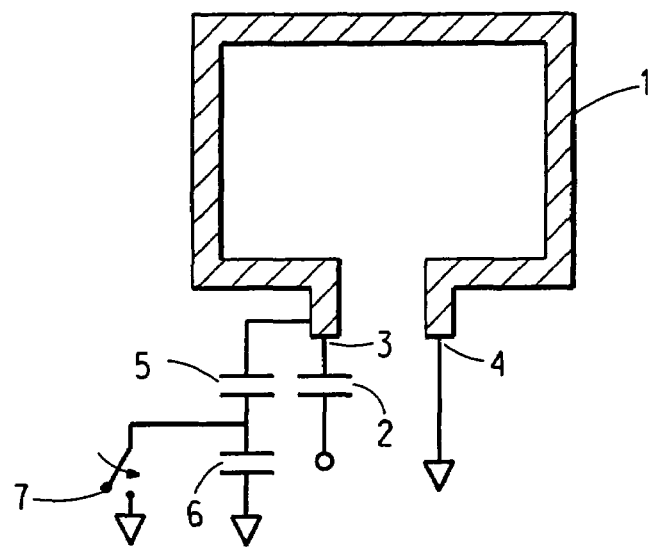
FIGS. 1A and 1B each show circuit configurations with a reactance that can be altered to shift the resonance frequency of a shielded loop resonator excitation coil.

This invention addresses the problem of coupling that may occur between an excitation coil and a high temperature superconductor receive coil in a nuclear quadrupole detection system. The resonance frequency of the excitation coil during excitation, and the resonance frequency of the receive coil during reception, must be set to be equal or essentially equal to each other, and must also be set to be equal or essentially equal to the nuclear quadrupole resonance frequency of an analyte material of interest, which will be or be contained in a sample to be analyzed or screened for the detection of nuclear quadrupole resonance. While it is preferred that such frequencies be exactly equal, it is sufficient if they are essentially equal in the sense that the frequency of the transmit coil(s) is in a range that will excite nuclear quadrupole resonance in the analyte material, and the frequency of the receive coil(s) is in a range that will detect nuclear quadrupole resonance in the analyte material.

Coupling between a transmit coil and a receive coil is greatest when they have the same or essentially the same frequency, and this coupling can result in serious performance problems. During sample excitation, the excitation magnetic field will induce a voltage in the receive coil. When a high Q high temperature superconductor receive coil is used, the induced or "ring-up" voltage could be large enough to damage the receive coil. A receive coil Q-spoiling circuit would prevent this from happening, but would also, as a result of the coupling, spoil the Q of the excitation coil. During reception, i.e. detection, of the NQR signal, the coupling would result in a degradation of the receive coil Q and a reduction in the sensitivity of the detector.

This invention provides a method for improving the performance of a NQR detection system by shifting the resonance frequency of the coil(s) not performing their function at that time, i.e. the frequency of the excitation coil(s) is shifted during reception. If the resonance frequencies of the excitation coil(s) and the high temperature superconductor receive coil(s) are adequately separated, their coupling is minimal. This allows each coil to perform its respective function, i.e. excitation or detection, as if the other coil(s) were not present. When using high-Q, high-temperature superconductor receive coils, it is preferred that the resonance frequencies of the receive coil(s) and the excitation coil(s) be separated by an amount that may, for example, be at least about 10% to reduce the coupling between coils to an acceptable level. Coupling is reduced to an acceptable level when, as stated above, each coil is able to perform its respective function, i.e. excitation or detection, as if the other coil(s) were not present.

The excitation coils used in this invention can be made of copper, silver, aluminum or a high temperature superconductor. A copper, silver or aluminum coil is preferably in the form of a shielded-loop resonator (SLR) coil. SLR's have been developed to eliminate the detuning effect of the electrical interaction between the coil and the surrounding material.

Preferably, one or more SLR copper excitation coils are used to apply the RF signal to the sample. The receive coils are high temperature superconductor coils. A high temperature superconductor receive coil is preferably in the form of a self-resonant planar coil, i.e. a surface coil, with a coil configuration of HTS on one or both sides of a substrate. High temperature superconductors are those that superconduct above 77K. The high temperature superconductors used to form the HTS self-resonant coil are preferably selected from the group consisting of $YBa_2Cu_3O_7$, $Tl_2Ba_2CaCu_2O_8$, $TlBa_2Ca_2Cu_3O_9$, $(TlPb)Sr_2CaCu_2O_7$ and $(TlPb)Sr_2Ca_2Cu_3O_9$. Most preferably, the high temperature superconductor is $YBa_2Cu_3O_7$ or $Tl_2Ba_2CaCu_2O_8$.

This invention provides a method for improving the performance of a NQR detection system by reducing the coupling between excitation and receive coils. The coupling is reduced by shifting the resonance frequency of the coils that are not performing their function at that time. The means for shifting frequency used has to provide the shift in frequency quickly, e.g. in less than about 1 μs. The means for shifting should not add significant losses to the receive coil, and should not interfere with the high power handling capabilities of the excitation coil.

Figure 1B:
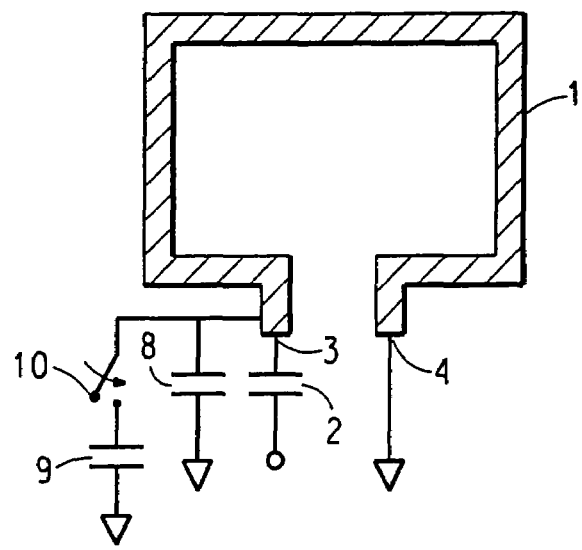

There are many ways to shift the resonance frequencies of the coils. The resonance frequency may be shifted, for example, by providing means for tuning the resonance frequency with which the frequency is tuned, and then altering the means for tuning to shift the resonance frequency of the coil. Means for tuning the resonance frequency of a coil may include, for example, a reactance, and altering such a reactance has the effect of re-tuning, i.e. shifting, the resonance frequency of the coil. Shorting out all or a portion of a reactance used as means for tuning a resonance frequency, or adding additional reactance, can accomplish the desired re-tuning, or shifting, of the resonance frequency of a coil.

Where capacitors are used as the reactance, FIGS. 1A and 1B illustrate several ways of varying the tuning capacitance with a shielded loop resonator excitation coil 1. In both figures, the input is fed to the SLR excitation coil 1 through the input capacitor 2 attached to one end 3 of the SLR excitation coil. The other end 4 of the SLR excitation coil is at ground.

In FIG. 1A, capacitors 5 and 6 are shown in a series configuration. Switch 7 can switch capacitor 6 in and out of the circuit. In one embodiment, the resonance frequency of the SLR excitation coil 1 is equal or essentially equal to the nuclear quadrupole resonance frequency of the analyte material when capacitor 5 is in the circuit, and switch 7 is closed to switch capacitor 6 out of the circuit. This would be the configuration during excitation. During reception, switch 7 would be opened to switch capacitor 6 into the circuit and thereby shift the resonance frequency of the SLR excitation coil. In another embodiment, the resonance frequency of the SLR excitation coil 1 is equal or essentially equal to the nuclear quadrupole resonance frequency of the analyte material when capacitors 5 and 6 are in the circuit, i.e. when switch 7 is open. This would be the configuration during excitation for this embodiment. During reception, switch 7 would be closed to switch capacitor 6 out of the circuit and thereby shift the resonance frequency of the SLR excitation coil 1.

In FIG. 1B, capacitors 8 and 9 are shown in a parallel configuration. Switch 10 can switch capacitor 9 in and out of the circuit. In one embodiment, the resonance frequency of the SLR excitation coil 1 is equal or essentially equal to the nuclear quadrupole resonance frequency of the analyte material when capacitor 8 is in the circuit and switch 10 is open to switch capacitor 9 out of the circuit. This would be the configuration during excitation. During reception, switch 10 would be closed to switch capacitor 9 into the circuit and thereby shift the resonance frequency of the SLR excitation coil 1. In another embodiment, the resonance frequency of the SLR excitation coil 1 is equal or essentially equal to the nuclear quadrupole resonance frequency of the analyte material when capacitors 8 and 9 are both in the circuit, i.e. when switch 10 is closed. This would be the configuration during excitation for this embodiment. During reception, switch 10 would be opened to switch capacitor 9 out of the circuit and thereby shift the resonance frequency of the SLR excitation coil.

A reactance that is a combination of capacitors, inductors and/or other circuit elements that effectively shift the resonance frequency of an excitation or receive coil can be used instead of the frequency shifting capacitors 6 and 9 shown, respectively, in FIGS. 1A and 1B. In similar embodiments, a reactance as shown and described above can be used to shift the resonance frequency of an HTS receive coil.

Figure 2:
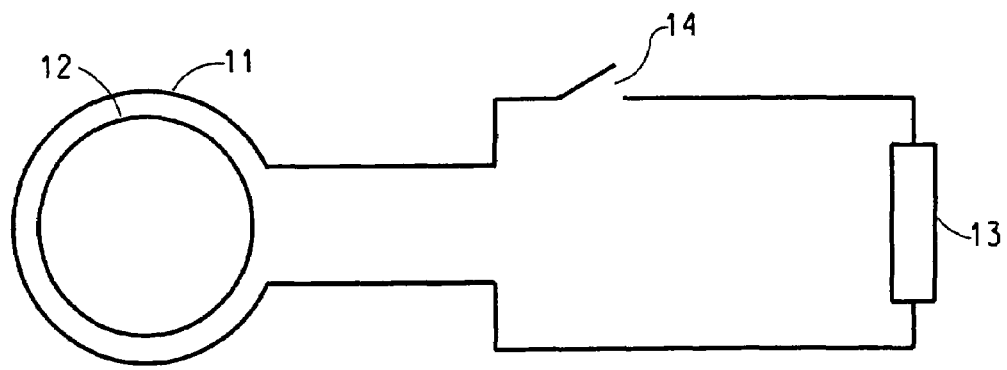
FIG. 2 shows a resonance frequency-shifting circuit comprised of a single loop inductively coupled to the coil whose frequency is to be shifted, a reactance in series with the single loop, and means for connecting the reactance to, and disconnecting the reactance from, the single loop.

Another way to shift the resonance frequency of a coil is to use a circuit comprised of a single loop or coil that is inductively coupled to the coil whose frequency is to be shifted. This is one of the preferred methods for shifting the frequency of a HTS receive coil. A reactance is in series with the single loop or coil, and means to connect the reactance to, and disconnect the reactance from, the single loop or coil is provided as well. The single loop or coil can be made of a regular conductor, such as copper, or a high temperature superconductor. The reactance can be an inductance, capacitance or combination of both. Means to connect the reactance to, and disconnect the reactance from, the single loop or coil may include at least one mechanical or electrical switch. A schematic diagram of such a circuit is shown in FIG. 2. A single loop 11 is inductively coupled to an excitation or receive coil 12. Additional loops, such as a coil (not shown) can be used to provide the desired inductive coupling. Connected to the single loop 11 are a reactance 13 and a switch 14 that connects and disconnects the reactance 13 to the single loop 11. The switch 14 can be a mechanical switch, or it can be an electrical switch such as a diode that conducts above a certain applied voltage.

Figure 3:
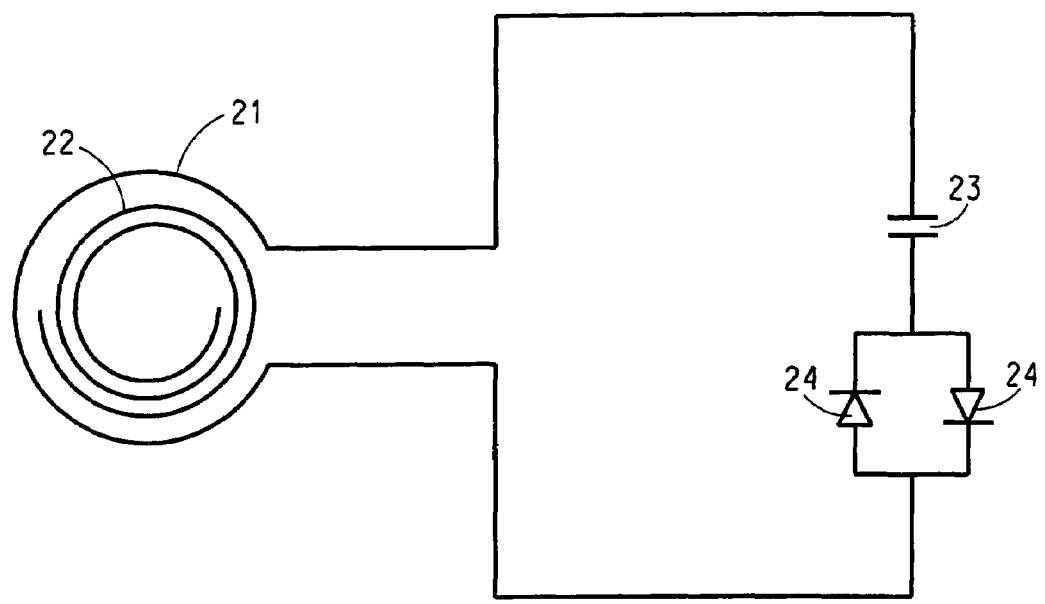
FIG. 3 shows a resonance frequency-shifting circuit comprised of a single loop inductively coupled to a receive coil whose frequency is to be shifted, and a capacitor and cross-diode pair switch in series with the single loop.

The switches used herein can be mechanical or electrical switches. One useful type of electrical switch is a cross-diode pair switch. The use of a cross-diode pair switch in a resonance frequency-shifting circuit for shifting the resonance frequency of a HTS receive coil is illustrated in FIG. 3. A single loop 21 is inductively coupled to the receive coil 22. Additional loops, such as a coil (not shown), can be used to provide the desired inductive coupling. Connected to the single loop 21 are a capacitor 23 and two diodes 24 arranged as a cross-diode pair switch. The capacitance of capacitor 23 and the inductance of the loop 21 result in a resonance frequency for the resonance frequency shifting circuit. The value of the capacitance is chosen so that when the cross-diode pair switch acts essentially as a short circuit, i.e. has low resistance, the resonance frequency of the resonance frequency shifting circuit is essentially the same as that of the receive coil, which is set to the NQR signal frequency to be detected.

When a low power RF signal impinges on loop 21, the induced voltage is not sufficient to turn on the diodes 24. Under these conditions, the cross-diode pair switch is effectively a high resistance, and the resonance frequency shifting circuit has minimal effect on the receive coil, i.e. the Q of the receive coil is not significantly decreased. As the power of the RF signal impinging on the coil increases, e.g. during excitation, the induced voltage increases and reaches a level at which the diodes are turned on and thus conduct. Under these conditions, the effective resistance of the cross-diode pair switch is low, and the resonance frequency of the resonance frequency shifting circuit is the same as that of the receive coil. As a result of the coupling between the receive coil and the loop, the degenerate frequencies split into two modes, one of higher frequency and one of lower frequency. Therefore, the deleterious effects of having the resonance frequencies of the receive coil and the excitation coil the same during sample excitation are avoided.

In another embodiment, a switch is connected between the two ends of a coil so that the coil can be shorted out when not carrying out the function for which it was designed, i.e. excitation or reception.

When there is an array of n HTS receive coils in a nuclear quadrupole detection system, where n is 2 or more, the receive coils may couple with one another as well as with the excitation coil. A capacitive circuit can be used in this situation to decouple the n receive coils. The capacitive circuit is comprised of n single loops or coils, each of which is inductively coupled to one of the n receive coils, and a capacitor that is connected to each pair of the single loops or coils. The capacitors are chosen so that each receive coil has a resonance frequency that is equal or essentially equal to the resonance frequency of the analyte material.

Figure 4:
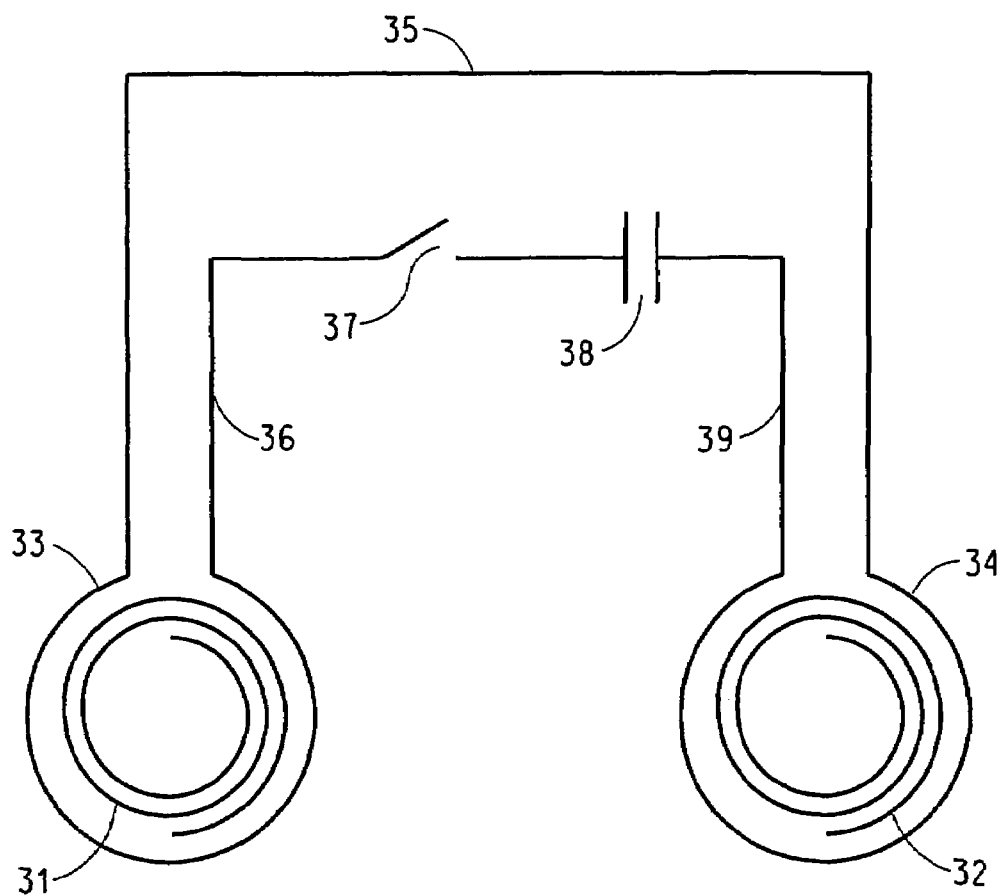
FIG. 4 illustrates the use of the circuit that decouples two receive coils to shift the resonance frequencies of the coils during excitation.

Two receive coils with a capacitive decoupling circuit as described in this embodiment are shown schematically in FIG. 4. The capacitive decoupling circuit is comprised of two single loops, each of which is inductively coupled to one of the receive coils, and a capacitor connected to the single loops. However, the capacitive decoupling circuit has been altered to include a switch. Two high temperature superconductor receive coils 31 and 32 are in the form of HTS planar coils. The HTS receive coils 31 and 32 are coupled as a result of their mutual inductance. As the distance between the centers of the HTS coils 31/32 decreases the coupling increases. The receive coils 31 and 32 are shown with single loops 33 and 34 that are inductively coupled to the receive coils 31 and 32, respectively. The single loops can be made from high temperature superconductors or from conducting metals such as copper. Electrical conductor 35 connects the one end of loop 33 to one end of loop 34. Electrical conductor 36 connects the other end of loop 33 to the switch 37 that is connected to capacitor 38. Electrical conductor 39 connects capacitor 38 to the other end of loop 34. The capacitive decoupling circuit can contain a single capacitor as shown in FIG. 4 where the capacitor has a fixed or variable value. Alternatively, however, the capacitive decoupling circuit can be comprised of three or more capacitors arranged in various configurations. When the switch 37 is closed, the receive coils 31 and 32 have resonance frequencies equal or essentially equal to the nuclear quadrupole resonance frequency of the analyte material. This would be the configuration during reception. When the switch is open, the resonance frequencies of the receive coils is shifted, and this would be the configuration during excitation.

What is claimed is:

1. A method of detecting a nuclear quadrupole resonance (NQR) signal from a sample at an NQR frequency, the method comprising:
    exciting the sample at an excitation frequency using an excitation coil, the excitation coil having a resonance frequency;
    receiving the NQR signal from the sample using a receive coil, the receive coil being a high-temperature superconductor (HTS) receive coil, the receive coil and the excitation coil being different coils; and
    upon completion of the excitation, shifting the resonance frequency of the excitation coil while receiving the NQR signal from the sample using the receive coil,
    so as to detect the NQR signal from the sample with reduced coupling between the excitation coil and the receive coil.

2. The method of claim 1, the resonance frequency of the excitation coil being shifted so as to eliminate the coupling between the excitation coil and the receive coil during reception of the NQR signal.

3. The method of claim 1,
    the resonance frequency of the excitation coil being equal to or essentially equal to the NQR frequency during excitation,
    the resonance frequency of the receive coil being equal to or essentially equal to the NQR frequency during reception of the NQR signal,
    the resonance frequency of the excitation coil being shifted by at least about 10% from the NQR frequency during reception of the NQR signal.

4. The method of claim 1, wherein shifting the resonance frequency of the excitation coil includes altering a reactance.

5. The method of claim 4, wherein altering the reactance includes shorting out all or a portion of the reactance.

6. The method of claim 4, wherein shifting the resonance frequency of the excitation coil includes operating a switch so as to alter the reactance.

7. The method of claim 6, wherein operating the switch connects to a capacitor during reception of the NQR signal, the capacitor being disconnected during excitation.

8. The method of claim 6, wherein operating the switch connects to a capacitor during excitation,
the capacitor being disconnected during reception of the NQR signal.

9. The method of claim 6, wherein the switch is a mechanical switch.

10. The method of claim 6, wherein the switch is an electronic switch.

11. The method of claim 1, wherein shifting the resonance frequency of the excitation coil includes shorting out the excitation coil during reception of the NQR signal.

12. The method of claim 1, the excitation coil being a shielded loop resonator coil.

13. The method of claim 1, wherein the excitation coil applies excitation to the sample for screening for the presence of explosives, drugs or other contraband.

14. A method of detecting a nuclear quadrupole resonance (NQR) signal from a sample at an NQR frequency with reduced coil coupling during signal reception, the method comprising:
exciting the sample at an excitation frequency using an excitation coil, the excitation coil having a resonance frequency equal to or essentially equal to the NQR frequency during excitation of the sample;
receiving the NQR signal from the sample using a receive coil, the receive coil being a high-temperature superconductor (HTS) receive coil, the receive coil and the excitation coil being different coils; and
upon completion of the excitation, shifting the resonance frequency of the excitation coil while receiving the NQR signal from the sample, so as to reduce coil coupling between the excitation coil and the receive coil to an acceptable level during reception of the NQR signal from the sample.

15. The method of claim 14, wherein the resonance frequency of the excitation coil is shifted by at least about 10% during reception of the NQR signal.

16. The method of claim 14, wherein the resonance frequency of the excitation coil is shifted by altering a reactance.

* * * * *